US010826093B2

(12) United States Patent
Berntsen et al.

(10) Patent No.: US 10,826,093 B2
(45) Date of Patent: Nov. 3, 2020

(54) FUEL CELL RESPONSE TO ELECTRICAL GRID FREQUENCY EVENTS

(71) Applicant: FuelCell Energy, Inc., Danbury, CT (US)

(72) Inventors: George P. Berntsen, Shelton, CT (US); Ramakrishnan Venkataraman, Danbury, CT (US)

(73) Assignee: FuelCell Energy, Inc., Danbury, CT (US)

( * ) Notice: Subject to any disclaimer, the term of this patent is extended or adjusted under 35 U.S.C. 154(b) by 0 days.

(21) Appl. No.: 16/306,444

(22) PCT Filed: Jun. 1, 2017

(86) PCT No.: PCT/US2017/035366
§ 371 (c)(1),
(2) Date: Nov. 30, 2018

(87) PCT Pub. No.: WO2017/210383
PCT Pub. Date: Dec. 7, 2017

(65) Prior Publication Data
US 2019/0305346 A1    Oct. 3, 2019

Related U.S. Application Data

(60) Provisional application No. 62/345,305, filed on Jun. 3, 2016.

(51) Int. Cl.
*H01M 8/04537* (2016.01)
*H01M 8/04082* (2016.01)
(Continued)

(52) U.S. Cl.
CPC ........ *H01M 8/04656* (2013.01); *G01R 31/00* (2013.01); *G01R 31/44* (2013.01);
(Continued)

(58) Field of Classification Search
CPC ... G01R 31/00; G01R 31/44; H01M 8/04208; H01M 8/04656; H01M 8/04753;
(Continued)

(56) References Cited

U.S. PATENT DOCUMENTS

2009/0174262 A1* 7/2009 Martin ................. H02M 3/157
307/82
2011/0008696 A1  1/2011 Ballantine
(Continued)

OTHER PUBLICATIONS

International Report on Patentability issued on PCT/US2017/035366 dated Dec. 13, 2018, 4 pages.
(Continued)

*Primary Examiner* — Victoria H Lynch
(74) *Attorney, Agent, or Firm* — Foley & Lardner LLP

(57) ABSTRACT

A method for addressing electrical grid frequency changes by a fuel cell system includes measuring, by a frequency sensor, a frequency of an electrical grid, determining that the frequency of the electrical grid differs from a normal frequency of the electrical grid by a threshold, determining, based at least in part on the measured frequency, an AC power setpoint bias, applying a magnitude limit, a rate-of-change limit, and a duration limit to the determined AC power setpoint bias to generate a limited power setpoint bias, generating a frequency adjusted power setpoint based on the limited power setpoint bias, and providing the frequency adjusted power setpoint to one or more control modules of the fuel cell system such that the fuel cell system adjusts a power output based on a difference between the measured frequency and the normal frequency.

18 Claims, 7 Drawing Sheets

(51) Int. Cl.
  *H01M 8/04828*   (2016.01)
  *H02J 3/38*      (2006.01)
  *H02J 3/48*      (2006.01)
  *H01M 8/04746*   (2016.01)
  *G01R 31/44*     (2020.01)
  *G01R 31/00*     (2006.01)
  *H01M 8/04992*   (2016.01)

(52) U.S. Cl.
  CPC ..... *H01M 8/0494* (2013.01); *H01M 8/04208* (2013.01); *H01M 8/04753* (2013.01); *H01M 8/04992* (2013.01); *H02J 3/387* (2013.01); *H02J 3/48* (2013.01)

(58) Field of Classification Search
  CPC .. H01M 8/0494; H01M 8/04992; H02J 3/387; H02J 3/48
  See application file for complete search history.

(56) References Cited

U.S. PATENT DOCUMENTS

2011/0257801 A1  10/2011  Kumula et al.
2013/0027993 A1  1/2013   Tan et al.

OTHER PUBLICATIONS

International Search Report and Written Opinion in PCT/US2017/035366 dated Aug. 22, 2017, 5 pages.

\* cited by examiner

FUEL CELL RESPONSE TO ELECTRICAL GRID FREQUENCY EVENTS

CROSS-REFERENCE TO RELATED PATENT APPLICATIONS

The present application is a U.S. national phase application under 35 U.S.C. § 371 of International Application No. PCT/US2017/035366, filed on Jun. 1, 2017, which claims the benefit of and priority to U.S. Provisional Patent Application No. 62/345,305, filed Jun. 3, 2016, the entire disclosures of which are incorporated herein by reference.

BACKGROUND

A fuel cell is a device which converts chemical energy, such as energy stored in a hydrocarbon fuel, into electrical energy by way of an electrochemical reaction. Generally, a fuel cell includes an anode electrode and a cathode electrode separated by an electrolyte that serves to conduct electrically charged ions. High temperature fuel cells, such as molten carbonate fuel cells and solid oxide fuel cells, operate by passing a reactant fuel gas through the anode electrode, while oxidant gas (e.g., carbon dioxide and oxygen) is passed through the cathode electrode. In order to produce a desired power level, a number of individual fuel cells can be stacked in series. In operation, a fuel cell system can provide electrical power to a load, such as an electrical grid. However, if such a load is unexpectedly removed from the fuel cell system (e.g., the electrical grid goes down), the power output of conventional fuel cell systems remains constant, potentially resulting load shedding and wide scale outages.

SUMMARY OF THE INVENTION

One embodiment relates to a method for addressing electrical grid frequency transients by a fuel cell system. The method includes measuring, by a frequency sensor, a frequency of an electrical grid. The method also includes determining that the frequency of the electrical grid differs from a normal frequency of the electrical grid by a threshold amount. The method also includes determining, based at least in part on the measured frequency, an AC power setpoint bias. The method also includes applying a magnitude limit, a rate-of-change limit, and a duration limit to the determined AC power setpoint bias to generate a limited power setpoint bias. The method also includes generating a frequency adjusted power setpoint based on the limited power setpoint bias. The method also includes providing the frequency adjusted power setpoint to one or more control modules of the fuel cell system such that the fuel cell system adjusts a power output based on a difference between the measured frequency and the normal frequency.

Another embodiment relates to a fuel cell system. The fuel cell system includes a fuel cell unit configured to generate an amount of electrical power for supply to an electrical grid, a frequency sensor configured to measure a frequency of the electrical grid, and a fuel cell controller communicatively coupled to the fuel cell unit and the frequency sensor. The fuel cell controller is configured to determine that the measured frequency of the electrical grid differs from a normal frequency of the electrical grid by a threshold amount. The fuel cell controller is also configured to determine, based at least in part on the measured frequency, an AC power setpoint bias. The fuel cell controller is also configured to apply a magnitude limit, a rate-of-change limit, and a duration limit to the determined AC power setpoint bias to generate a limited power setpoint bias. The fuel cell controller is also configured to generate a frequency adjusted power setpoint based on the limited power setpoint bias. The fuel cell controller is also configured to provide control signals to one or more subsystems of the fuel cell system based on the frequency adjusted power setpoint.

DETAILED DESCRIPTION

Figure 1:
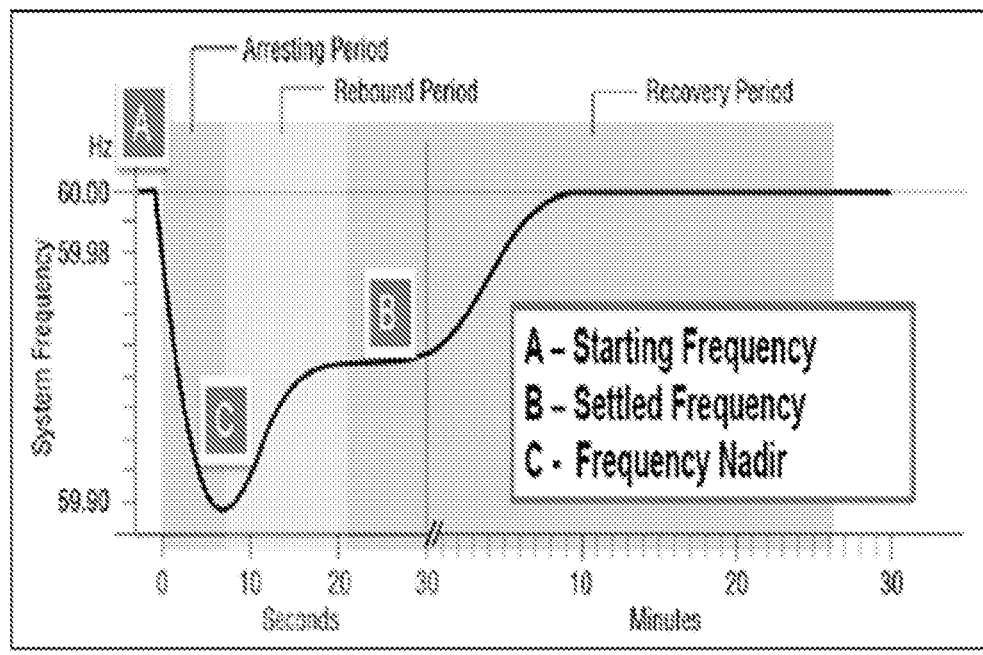
FIG. 1 depicts a grid frequency event in accordance with an illustrative embodiment.

FIG. 1 depicts a grid frequency event in accordance with an illustrative embodiment. As depicted in FIG. 1, the normal system frequency (or starting frequency) of the electrical grid is 60 Hertz (Hz). During an initial arresting time period, the normal system frequency begins to drop and traditional generators remaining on the grid counter the drop by releasing their stored kinetic energy into the system. The frequency reaches its nadir (or low point), which is followed by a rebound period during which the frequency starts to recover. In a matter of seconds, the frequency settles at a value above the nadir and then slowly continues to rebound back to the starting frequency. The time that it takes for the frequency to increase from the settled frequency back to the starting frequency is referred to as the recovery period, which may take several minutes.

As the penetration of renewable/alternate generation resources (e.g. solar photovoltaic, wind, fuel cells) increases, traditional generators are being displaced. Renewable generators are predominately static inverter-based and therefore do not have an inherent inertial response. Electric utilities, Independent System Operators (ISO), and industry researchers have identified that the lower system inertia associated with the increased penetration of renewable generation can result in higher rate of change of frequency (ROCOF) and a lower frequency nadir following the sudden loss a large central generator. A more severe frequency transient could trigger automatic under-frequency load shedding schemes resulting in wide-scale customer outages and more difficulty restoring the bulk electric system to normal.

Manufacturers of large wind and solar photovoltaic (PV) inverters have implemented control schemes to provide a synthetic inertial response to grid frequency transients. This scheme requires that the renewable generator normally operate at power levels below the maximum possible for the given wind or sunlight conditions. This provides power output headroom so that on a sudden drop in grid frequency, the wind or solar PV inverter controls can ramp up power proportionally and thus contribute to system inertia in arresting the rate of change and nadir of the frequency transient. This synthetic inertial response is also referred to as a fast frequency response, and is depicted in FIG. 2.

Figure 2:
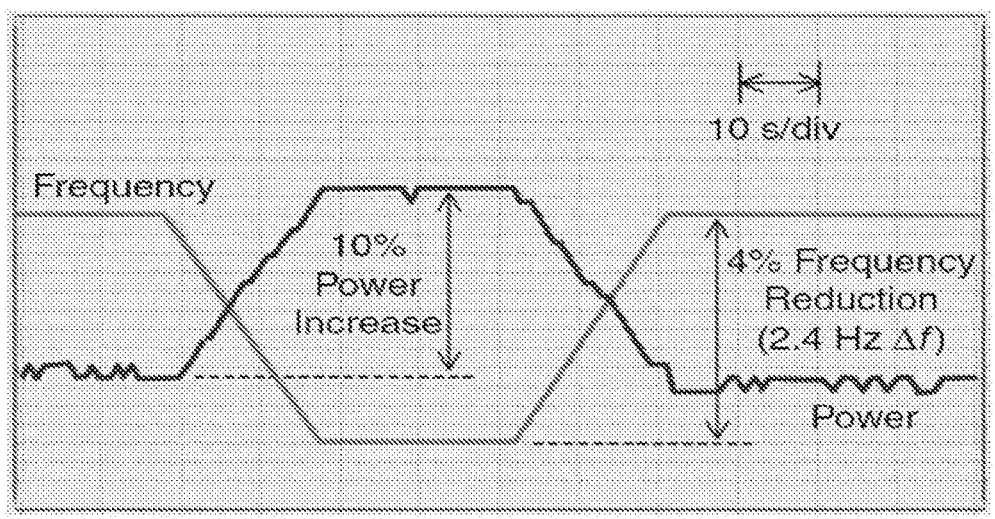
FIG. 2 depicts a fast frequency response in accordance with an illustrative embodiment.

Specifically, FIG. 2 depicts a 4% reduction in the frequency of the electrical grid, which amounts to a drop of 2.4 Hertz (Hz) on a 60 Hz signal. As the frequency drop of the electrical grid is detected, the solar or wind system increases its power output by 10% using the above-discussed built in headroom that is incorporated into such systems. As a result, the frequency reduction in the electrical grid is compensated and returns back to normal after a brief period of time.

Fuel cell generators, particularly in large scale grid support applications, may eventually be required to contribute to the bulk electric system inertia in order to obtain electrical interconnection approval from grid operators. Alternatively, grid operators may eventually offer ancillary service payments for this inertial response function which would enhance the financial aspects of a fuel cell generation project. However, there are no current systems or solutions that allow fuel cell generators to provide an inertial frequency response function. Fuel cells have advantages and limitations in providing an inertial frequency response as compared to wind and solar PV plants. Described herein is a system that addresses fuel cell technology limitations so that inherent short term energy storage and inertia advantages of fuel cell systems can be fully exploited in promoting bulk electric system stability.

Although fuel cell generation plants are static inverter based systems, unlike wind and solar PV generators, the fuel cell stacks themselves have inherent short term energy storage and inertial characteristics. Fuel cell stacks have internal capacitance and large heat capacity. These characteristics allow a fuel cell generator to provide a very fast increase in power above its normal output rating during the initial critical seconds of a frequency transient. There is no need to curtail the plant's power output to provide headroom for a fast frequency, synthetic inertial response. The subject matter described herein defines the depth and extent of inertial response that can be implemented while keeping the fuel cell operating safely and without loss of output capacity. Output increase of up to 10% and durations of up to 30 seconds have been determined as optimal for a high temperature fuel cell stack. The extent and duration of output increase for fuel cell stacks fits well with anticipated grid inertial response needs. The resulting economic advantage is that the fuel cell plant can maximize its revenue generation while also contributing to bulk electric system stability. This capability could be a potential additional revenue stream or may eventually be required by system operators to interconnect a large fuel cell park to the bulk electric system. The solution does not require additional hardware and precludes the cost and energy losses associated with using large scale energy storage systems to provide synthetic inertia response service. If this solution is widely deployed in large scale, ancillary service economics can result in ultra-clean, high efficiency fuel cells providing enough inertial response such that wind and solar PV farms do not need to. This will allow wind and solar PV farms to maximize the harvesting of renewable wind and solar energy, as opposed to having to curtail their outputs to be able to address frequency drops in the electrical grid.

The new control methods described herein can be completely implemented within the existing fuel cell plant controller with no hardware or certification changes. However, evolving electrical grid codes and standards may eventually necessitate embedding some portions of the subject matter described herein in the inverter controller for certification purposes.

The algorithms and methods described herein enable fuel cell plants, such as a molten carbonate fuel cell plant, to provide a power output response to electrical grid frequency events that emulates the inertial response of the large, synchronous generators used in coal, gas fired and nuclear units which have traditionally dominated the bulk electric system (grid). Although fuel cell generators use inertia-less static inverters instead of synchronous, rotating generators, fuel cell stacks have inherent, short term, energy storage in the form of stack capacitance and thermal inertia characteristics which can accommodate a momentary increase in power output. A new algorithm in the fuel cell controller will quickly adjust DC power from the fuel cell stacks in proportion to the amount of deviation from nominal grid frequency during the initial critical seconds of a bulk power system frequency transient so as to assist in arresting the rate of change of the frequency change and, in the event of an under-frequency event, the minimum value (nadir). The system is able to do this while keeping the power adjustment within the capability of what can be supported by the fuel cells.

Figure 3:
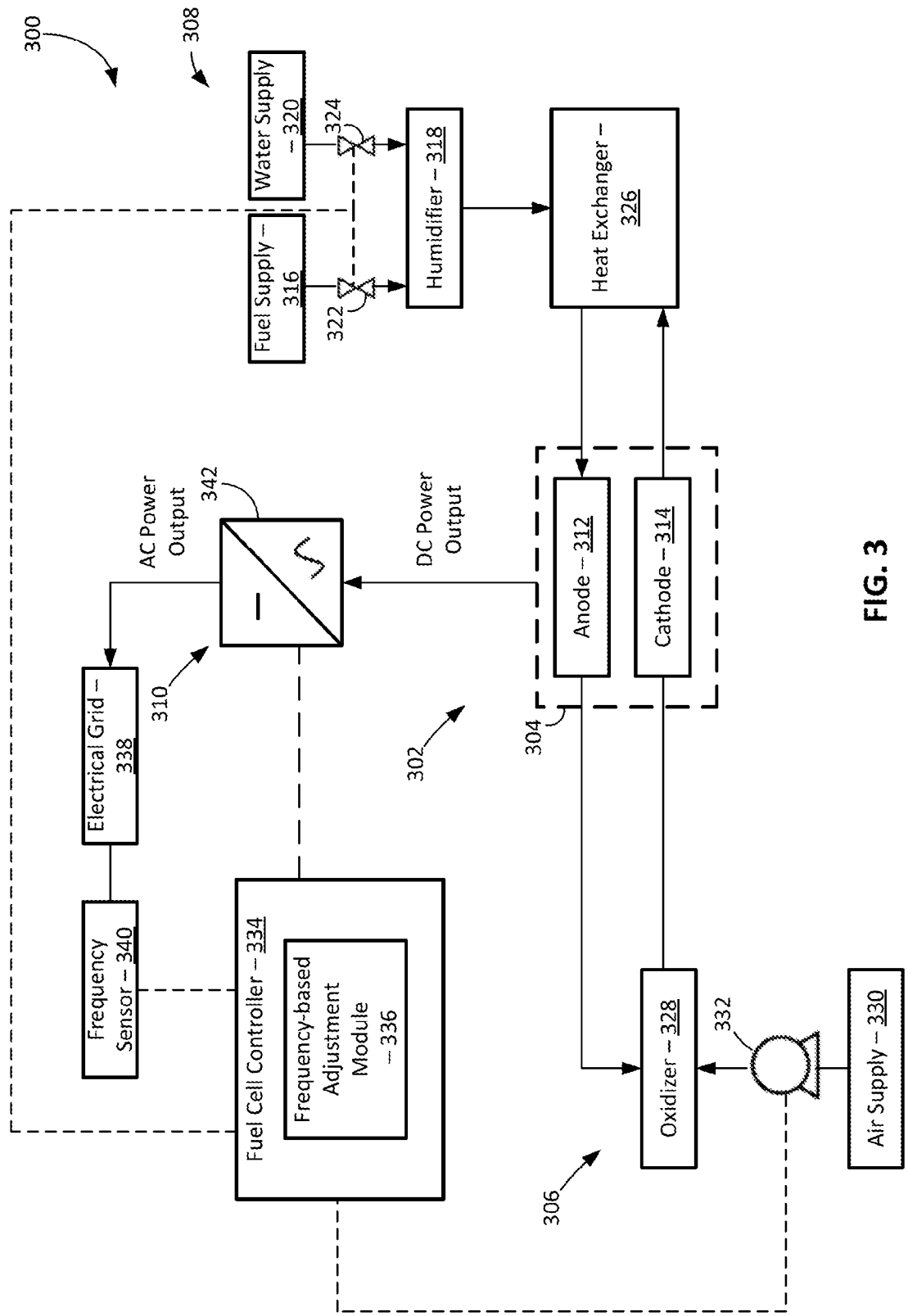
FIG. 3 is a block diagram of a fuel cell system in accordance with an illustrative embodiment.

FIG. 3 is a block diagram of a fuel cell system 300 in accordance with an illustrative embodiment. The fuel cell system 300 includes a fuel cell module 302 configured to generate an amount of electrical power for supply to an electrical grid 338. The fuel cell module 302 includes one or more fuel cell stacks 304. In various embodiments, the one or more fuel cell stacks 304 may include high temperature molten carbonate fuel cells. While the fuel cell system 300 is shown to a single fuel cell module 302, the systems and methods disclosed herein may be implemented in a fuel cell system with any number of fuel cell modules in any configuration.

In various embodiments, the fuel cell stacks 304 may be internally reforming fuel cell stacks that include direct internal reforming, indirect internal reforming, or a combination thereof. As such, in one embodiment, each of the fuel cell stacks 304 includes an internal reforming unit which modifies fuel (e.g., from a fuel supply 316) and outputs reformed fuel including hydrogen and carbon monoxide to the anode 312. Oxidant gas is supplied to the cathodes 314 via means described herein. Reformed fuel provided to the anode 312 then undergoes an electro-chemical reaction with the oxidant gas to produce water and an output of electrical power.

In the example shown, the fuel cell system 300 includes an airflow control module 306, a fuel flow control module 308, and an inverter control module 310. A fuel cell controller 334 is communicatively coupled to the control modules 306, 308, and 310 and configured to provide control signals to various components of the control modules 306, 308, and 310 to control the power output of the fuel cell system 300 in response to frequency transients of the electrical grid 338.

In the example shown, the fuel flow control module 308 includes a fuel supply 316, a water supply 320, and a humidifier 318. Fuel from the fuel supply 316 is introduced into a humidifier 318 via a connecting line. The humidifier 318 also a receives water from the water supply 320 via an additional connecting line, and combines the fuel and the water to humidify the fuel for use by the fuel cell module 302. In various embodiments, the rates at which fuel and water are supplied to the humidifier 318 are controlled via flow control devices, shown as valves 322 and 324 disposed within the connecting lines. As described herein, in some embodiments, the operational state of the valves 322 and 324 and inverter 342 are controlled by the fuel cell controller 334 to change the electrical power output produced by the fuel cell system 300 based in part on a change in frequency of the electrical grid 338.

Humidified fuel then passes through a heat exchanger 326 for heating prior to introduction into the fuel cell module 302. In some embodiments, prior introduction into the heat exchanger 326, the humidified fuel is introduced into a pre-converter (not shown), where the fuel is partially reformed. Additionally, various other fuel processing steps (e.g., deoxidization, desulfurization) may be performed prior to introduction of the fuel into the fuel cell module 302. Heated fuel is then introduced into the anode 312 of the fuel cell stacks 304. At the same time, oxidized air originating from the air supply 330 is fed into the cathode 314 of the fuel cell stack 304, causing the heated fuel to undergo an electro-chemical reaction to produce electrical power to be output. Cathode exhaust outputted from the cathode 314 is provided to the heat exchanger 326 to heat humidified fuel prior to introduction into the anode 312.

In the example shown, the airflow control module 306 includes an oxidizer 328, an air supply 330, and a blower 332. Exhaust produced by the anode 312 is provided to the oxidizer 328. The oxidizer 328 may include a mixer that mixes the anode exhaust with a first portion of preheated air received from an air supply 330 to produce an oxidant gas. The oxidant gas may be combined with a second portion of pre-heated air from the air supply 330 to produce an input oxidant gas for input to the cathode 314.

In some embodiments, the air supply 330 includes fresh air gathered by a blower 332 from the surroundings of the fuel cell module 302. The blower 332 pressurizes the air prior to the air's introduction into the oxidizer 328. In some embodiments, the output of the blower 332 is provided to an additional heat exchanger (not shown) that heats the air prior to the air's introduction to the oxidizer 328. In some embodiments, cathode exhaust output from the fuel cell module 302 provides heat to the additional heat exchanger. As discussed above, a first portion of the pre-heated air is supplied to the oxidizer 328, and a second portion is routed around the oxidizer 328 and recombined with the first portion prior to introduction into the cathode 314. In some embodiments, the amount of air introduced into the oxidizer 328 is controlled (e.g., via controlling flow control valves in supply lines) via the fuel cell controller 334 to support a level of power output by the fuel cell system 300.

The inverter control module 310 includes an inverter 342 configured to draw the DC power output by the fuel cell module 302 and convert the DC power output to AC power. In various embodiments, the inverter 342 may include an insulated gate bipolar transistor inverter. The AC power outputted by the inverter 342 is supplied via to a consumer bus (not shown) via one or more transformers and then provided to an electrical grid 338 for utilization. In various embodiments, the inverter 342 may operate based on a setpoint provided by the fuel cell controller 334. The setpoint controls the amount of DC power drawn by the inverter 342. As such, by controlling the setpoint, the fuel cell controller 334 may impact the amount of AC power supplied by the fuel cell system 300 to the electrical grid 338.

As described herein, the electrical grid 338 may operate within a predetermined range of frequencies (herein referred to as a "normal frequency") during a regular state of operation. However, sudden disconnections of electrical generation from the electrical grid 338 may lead to a substantial decrease in the operating frequency in the electrical grid 338. A frequency sensor 340 is configured to measure such deviations. The frequency sensor 340 receives a signal from the electrical grid 338 and measures the frequency of that signal. Any known form of frequency measurement device may be used.

In various embodiments, the fuel cell controller 334 is configured to control various operational parameters of the fuel cell system 300 including, but not limited to an amount of fuel from the fuel supply 316 introduced into the fuel cell module 302 (e.g., via control of the valve 322), an amount of water from the water supply 320 supplied to the humidifier 318 (e.g., via control of the valve 324), the pressure of oxidant gas supplied to the fuel cell module 302 (e.g., via control of the blower 332), the setpoint of the inverter 342, and the amount of air bypassed around a heat exchanger to control the temperature of the oxidant gas input to fuel cell module 302. The fuel cell controller 334 can be computerized, and may include a processor, memory, transceiver, and user interface. The memory can be configured to store computer-readable instructions for controlling the fuel cell system. The processor, which is operatively coupled to the memory, is configured to execute the instructions to implement the desired control of the fuel cell system. The transceiver allows the fuel cell controller 334 to communicate with other devices and systems, and to receive monitored data that informs control decisions, send alerts, etc. The user interface allows a system operator to manually control/adjust the control system, set thresholds, etc.

In various embodiments, the fuel cell controller 334 includes a frequency-based adjustment module 336. In some embodiments, the frequency-based adjustment module 336 includes program logic stored on a system memory (not shown) of the fuel cell controller 334. The frequency-based adjustment module 336 is configured to receive an indication of the operational frequency of the electrical grid 338 (e.g., from the frequency sensor 340) as an input and generate a sequence of control parameters to alter the electrical power output produced by the fuel cell system 300 in response to frequency transients. The frequency-based adjustment module 336 performs various operations to generate such control parameters. In this regard, the frequency-based adjustment module 336 includes various functions and sub-modules. Such components and their interrelationship are described in more detail with respect to FIG. 4.

Figure 4:
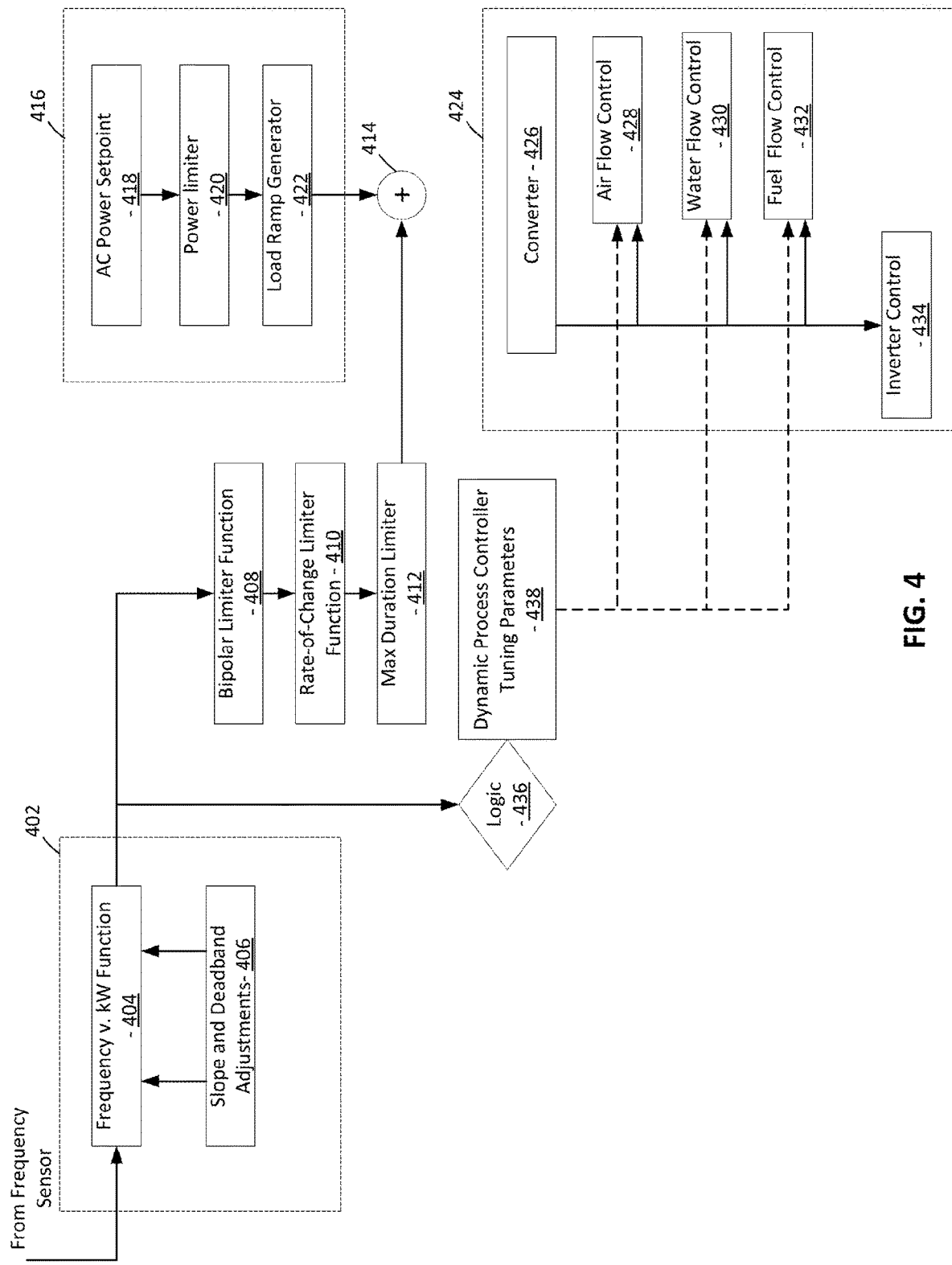
FIG. 4 is a block diagram depicting a system for utilizing a fuel cell generator to provide an inertial response to electrical grid frequency events in accordance with an illustrative embodiment.

FIG. 4 is a block diagram depicting a system for utilizing a fuel cell system to provide an inertial response to electrical grid frequency events in accordance with an illustrative embodiment. A synthetic inertial frequency response function 402 is used in part to identify a change in frequency. Specifically, the synthetic inertial frequency response function 402 receives a measurement of the frequency of the electrical grid 338 (e.g., from the frequency sensor 340). The measured frequency is provided to a frequency vs. kilowatt (kW) droop function 404. The frequency vs. kW droop function 404 provides an increase in the power output for grid frequencies below a normal frequency and a decrease in power output for grid frequencies above a normal frequency, resulting in a synthetic inertial response to grid frequency transients.

The frequency vs. kW droop function 404 has an adjustable deadband and slope 406. Deadband adjustments can be used to preclude a power response until the measured grid frequency deviation from nominal is sufficient to necessitate a synthetic inertial response (e.g., set a threshold for a response). The slope adjustments are used to control how much power output change results from a given amount of frequency deviation. The deadband and slope adjustments 406 are received as inputs to the frequency vs. kW droop function 404. In an illustrative embodiment, the slope and deadband adjustments can be made by a control module (e.g., the frequency-based adjustment module 336) that is configured to calculate the appropriate values for slope and deadband. Alternatively, slope and/or deadband adjustments may be made by a system operator through a user interface.

In the context of wind and solar PV plants, the output of a frequency vs. kW droop function is typically applied directly to the plant's inverter controls to change the output power level. However, as discussed above, in order to provide the under frequency/up-power response, wind and solar PV plants need to normally operate at power levels below the amount achievable with the existing wind or solar conditions in order to provide headroom to increase power when a grid frequency event occurs. In the context of a fuel cell system (e.g., the fuel cell system 300), the output of the synthetic inertial frequency response function 402 is configured as a bi-polar power setpoint bias that is proportional to the measured grid frequency deviation from nominal. The power setpoint bias is applied to a bipolar limiter function 408 to keep the power output of the fuel cell stack(s) within the range that the fuel cell can support. The limits of the bipolar limiter function 408 can be dynamic, e.g. 10% of the AC power setpoint. This will accommodate partial load operation such as during load ramping operations.

The magnitude-limited bi-polar power setpoint bias is applied to a rate-of-change limiter function 410. The value of the rate-of-change limiter function 410 can be a fixed value specific to the fuel cell system (e.g., such as the fuel cell system 300). The rate-of-change limiter function 410 is configured to limit how fast the fuel cell power setpoint bias can change in response to a grid frequency change. A purpose of the rate-of-change limiter function 410 is to ensure that the fuel cell plant's process controls (e.g. air flow, fuel flow, water flow, etc.) can be coordinated to support the inverter power output change and achieve the optimal amount of synthetic inertial response without causing abnormal process conditions and risking an automatic fuel cell shutdown.

The magnitude and rate limited bi-polar power setpoint bias is applied to a maximum duration limiter 412. The value of the maximum duration limiter 412 can be a fixed value specific to the fuel cell system. The maximum duration limiter 412 is used to keep the power output within the capability of the fuel cell stack(s) should the grid frequency deviation last longer than the short term power transient capabilities of the fuel cell stack(s). In alternative embodiment, the magnitude, rate, and duration limits can be applied in a different order. The limits can be determined using software such that appropriate values are used for the specific fuel cell system. Example limit values can be magnitude=10% of the AC power setpoint; rate=5% of the AC power setpoint per second; and duration=15 seconds. These values could change with operating experience and fuel cell technology advancements.

The magnitude, rate, and duration limited, bipolar power setpoint bias is then applied to a summation function 414. A summation function is described in U.S. Pat. No. 7,800,340, the entire disclosure of which is incorporated by reference herein. The other input to the summation function is the normal AC power setpoint, which is generated by block 416 of FIG. 4. In the block 416, a baseline AC power setpoint 418 is set by a user or control module of the fuel cell system. The baseline AC power setpoint 418 is fed to a power limiter 420 that is configured to limit the baseline AC power setpoint 418 such that the rated power output of the fuel cell system is not exceeded. The output of the power limiter 420 is fed to a load ramp generator 422 which is configured to control and limit the rate at which power of the fuel cell system can increase or decrease.

The output from the load ramp generator 422 is the normal AC power setpoint for the fuel cell system, and is fed to the summation function 414 along with the output from the maximum duration limiter 412. As a result, the normal AC power setpoint is negatively or positively adjusted based on the magnitude, rate, and duration limited bi-polar AC power setpoint bias (i.e., the output from the maximum duration limiter 412) to generate a frequency adjusted AC power setpoint. Additionally, in some embodiments, the magnitude, rate, and duration limited bi-polar AC power setpoint bias bypasses the power limiter 420 and the load ramp generator 422 so as to provide a fast power increase or decrease and, in the case of a power increase, a temporary overload beyond the normal, steady state, fuel cell power rating.

The frequency adjusted AC power setpoint is fed from the summation function 414 to a control module 424. The control module 424 includes a converter 426 that is configured to receive the frequency adjusted AC power setpoint from the summation function 414 and to convert it into a frequency adjusted DC power setpoint for the system. The frequency adjusted DC power setpoint is then fed to an air flow control module 428, a water flow control module 430, a fuel flow control module 432, and an inverter control module 434 to control operation of the fuel cell system in accordance with the frequency adjustment (e.g., via adjustment of any of the parameters discussed with respect to FIG. 3).

The output of the synthetic inertial frequency response function 402 (i.e., the bi-polar AC setpoint bias) is also directly applied to a logic function 436. The logic function 436 is configured to trigger the generation dynamic proportional, integral, and derivative (PID) tuning parameters and feed-forward values. The dynamic tuning parameters and feedforward values can be determined by engineering evaluation for a given power plant configuration/design. The logic function 436 is a binary function that detects when the output from the synthetic inertial frequency response function 402 becomes non-zero and triggers block 438, which includes a PID generation algorithm, to apply tuning parameters and feedforward values to cause faster process control action than is used during normal operation. Feedforward refers to a process in which a process controller output is forced to a pre-determined value momentarily apart from the PID algorithm to give the controller a head start on responding quickly. The dynamic PID tuning parameters and feedforward values are fed to the air flow control module 428, the water flow control module 430, and the fuel flow control module 432 to enhance the coordination of fuel cell power output change and the supporting chemical reactants.

Figure 5:
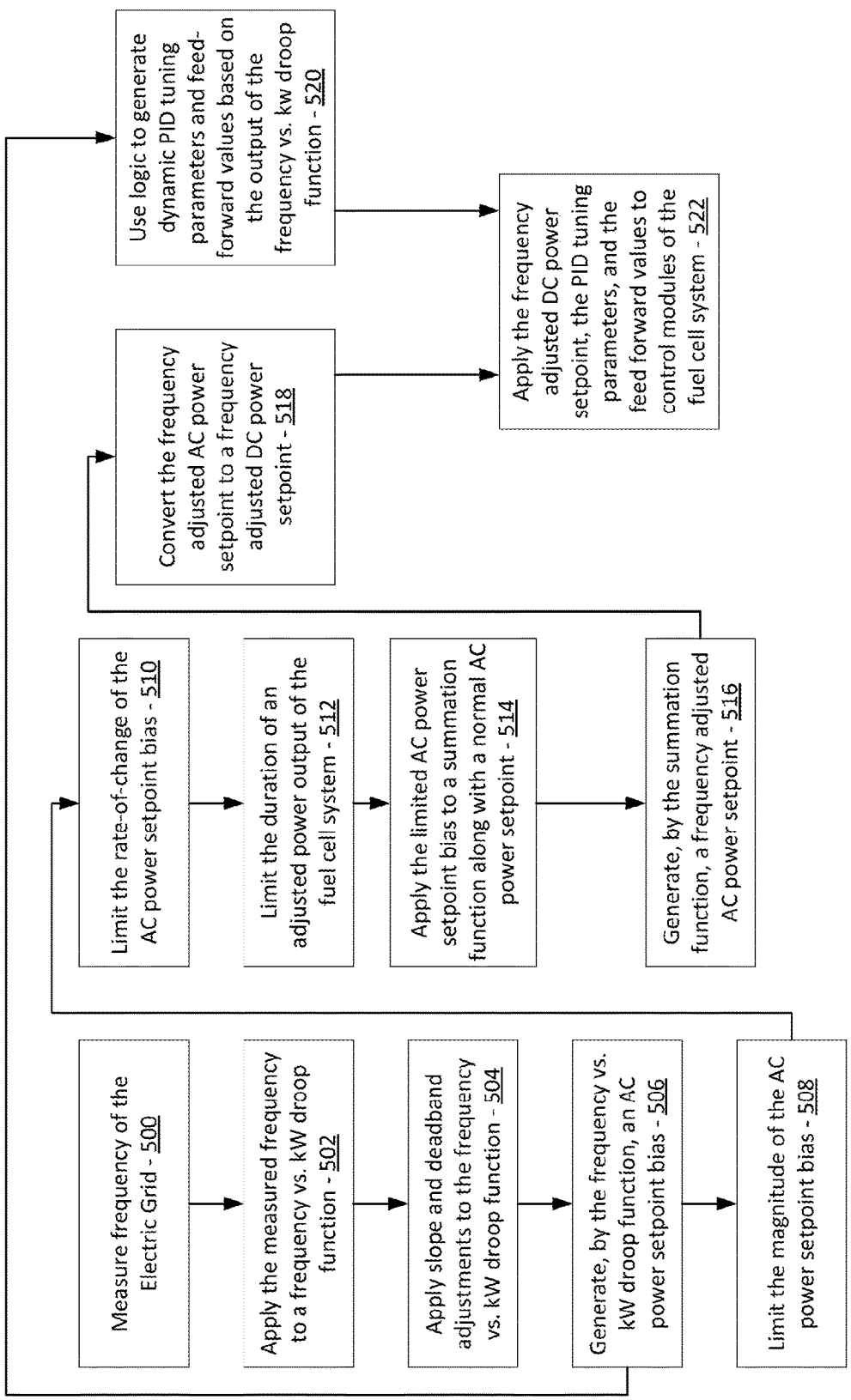
FIG. 5 is a flow diagram depicting operations performed by a fuel cell system to provide an inertial response to electrical grid frequency events in accordance with an illustrative embodiment.

FIG. 5 is a flow diagram depicting operations performed by a fuel cell system (e.g., the fuel cell system 300) to provide an inertial response to electrical grid frequency events in accordance with an illustrative embodiment. In an operation 500, a frequency of the electrical grid is measured. The electrical grid frequency can be measured using any type of frequency sensor or frequency sensing algorithm known in the art. In an operation 502, the measured frequency is applied to a frequency vs. kW droop function. In an operation 504, slope and deadband adjustments are also applied to the frequency vs. kW droop function. Based on the measured frequency and the slope and deadband adjustments, the frequency vs. kW droop function generates an AC power setpoint bias in an operation 506.

In an operation 508, the magnitude of the AC power setpoint bias is limited. In an illustrative embodiment, the bipolar limiter function 408 discussed with reference to FIG. 4 can be used to limit the magnitude of the AC power setpoint bias. In an operation 510, the rate-of-change of the AC power setpoint bias is limited. In an illustrative embodiment, the rate-of-change limiter function 410 discussed with reference to FIG. 4 can be used to limit the rate-of-change. In an operation 512, the duration of the AC power setpoint bias is limited. The duration limit can be imposed by the maximum duration limiter 412 described with reference to FIG. 4.

In an operation 514, the (magnitude, rate-of-change, and duration) limited AC power setpoint bias is applied to a summation function along with a normal AC power setpoint. In an illustrative embodiment, the summation function 414 from FIG. 4 can be used, and the normal AC power setpoint can be provided by block 416 of FIG. 4. As a result of the summation function, the normal AC power setpoint is adjusted in accordance with the limited AC power setpoint bias. Specifically, in an operation 516, a frequency adjusted AC power setpoint is generated by the summation function. In an operation 518, the frequency adjusted AC power setpoint is converted to a frequency adjusted DC power setpoint. Such conversion can be performed by any converter device or logic known to those of skill in the art.

In an operation 520, logic is used to generate dynamic PID tuning parameters and feed-forward values based on the output of the frequency vs. kW droop function from the operation 506. In an operation 522, the frequency adjusted DC power setpoint is applied to control modules of the fuel cell system along with the dynamic PID tuning parameters and feed-forward values. The control modules can include, for example, the air flow control module 428, the water flow control module 430, the fuel flow control module 432, and the inverter control module 434 described with reference to FIG. 4.

Figure 6:
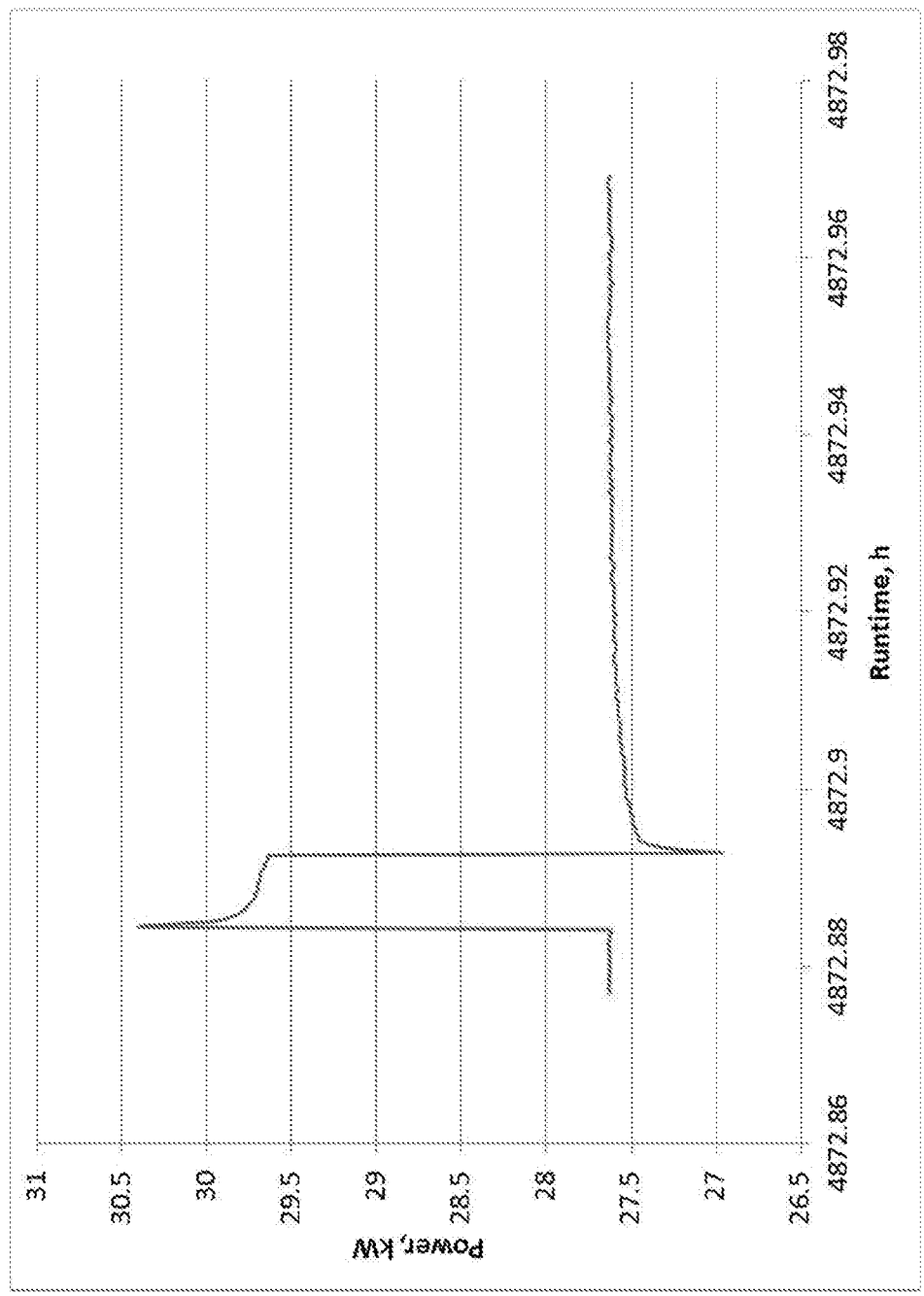
FIG. 6 depicts power output of a 30 kW fuel cell stack during simulated inertial response to a grid frequency event in accordance with an illustrative embodiment.
Figure 7:
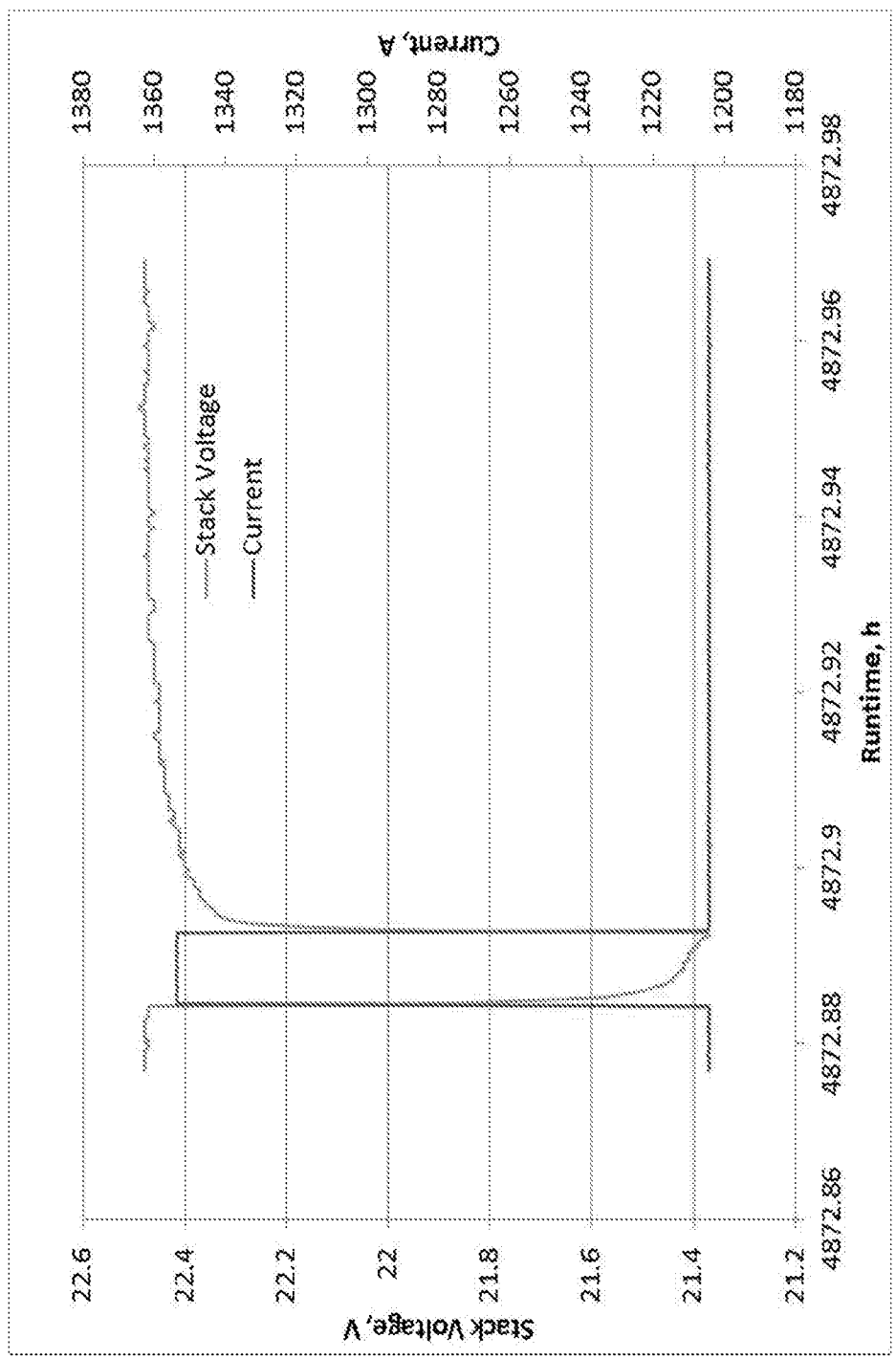
FIG. 7 depicts voltage response of a 30 kW fuel cell stack during simulated inertial response to a grid frequency event in accordance with an illustrative embodiment.
Figure 8:
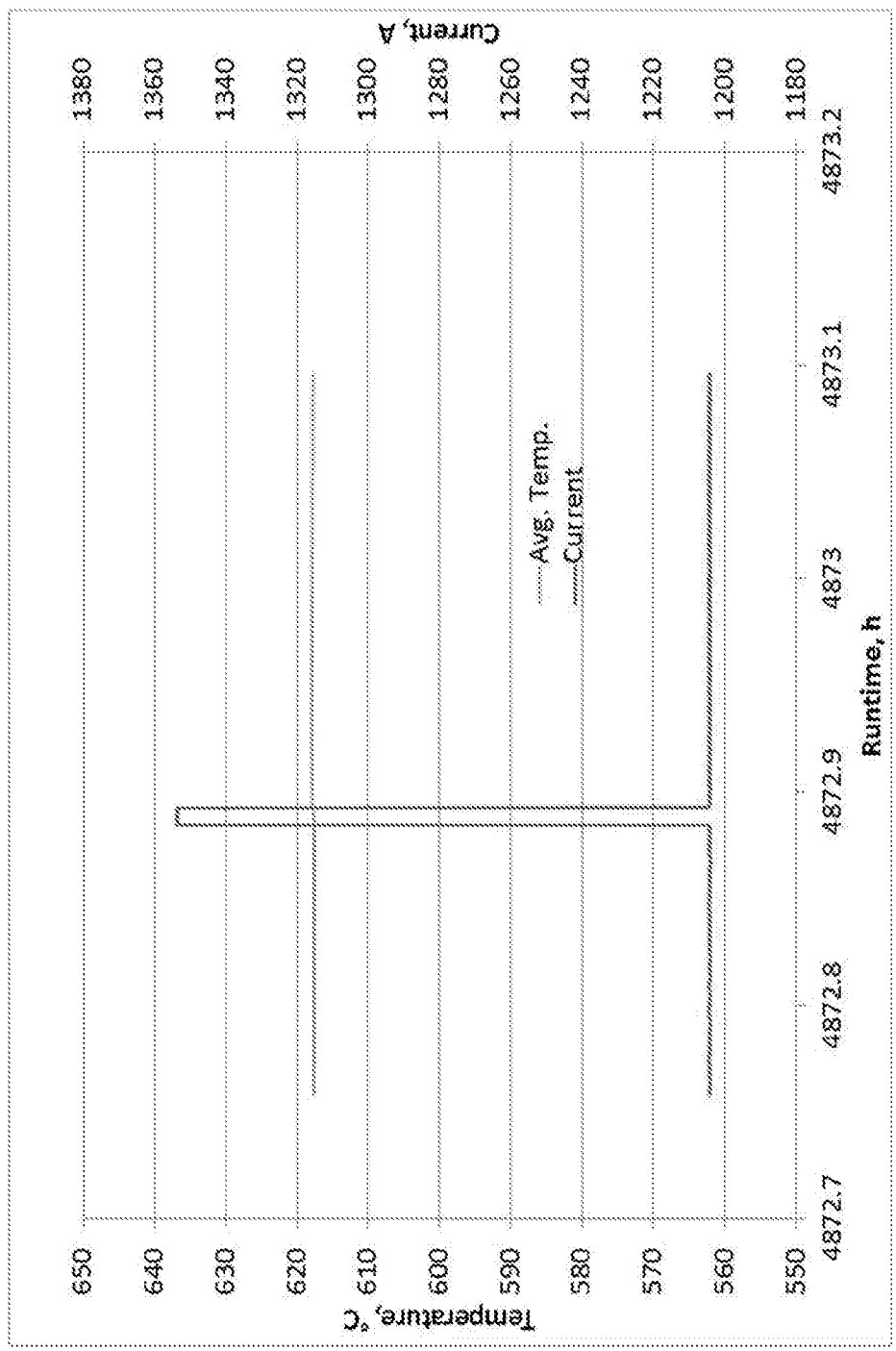
FIG. 8 depicts temperature response of a 30 kW fuel cell stack during simulated inertial response to a grid frequency event in accordance with an illustrative embodiment.

An illustrative embodiment of a fuel cell stack inertial response is shown in FIGS. 6-8, wherein the power output of a 30 kW fuel cell stack is instantaneously increased by 10% for a duration of 30 seconds with no change in gas flows. Current flow in the stack is increased. As can be seen from FIG. 6, the output increases sharply before stabilizing upon increase in current. Likewise, the output drops below nominal briefly upon reduction in current before returning to normal values. A smoother output response can be achieved if current is ramped up and down. FIG. 7 shows that voltages return to typical values a few minutes after the power is reduced back to normal values. No noticeable change in temperatures is seen from this power increase as indicated by FIG. 8.

In an illustrative embodiment, any of the operations described herein can be implemented in the form of computer-readable instructions stored on a computer-readable medium, such as a computer memory. Upon execution of the computer-readable instructions by a processing device, the processing device is configured to perform the various operations.

In various embodiments, the fuel cell controller 334 may be computerized. As such, the fuel cell controller 334 may include a processing circuit including a processor and a memory. The processor may be a general purpose or specific purpose processor, an application specific integrated circuit (ASIC), one or more field programmable gate arrays (FPGAs), a group of processing components, or other suitable processing components. The processor may be configured to execute computer code or instructions stored in memory or received from other computer readable media (e.g., CDROM, network storage, a remote server, etc.) to perform one or more of the processes described herein. The memory may include one or more data storage devices (e.g., memory units, memory devices, computer-readable storage media, etc.) configured to store data, computer code, executable instructions, or other forms of computer-readable information. The memory may include random access memory (RAM), read-only memory (ROM), hard drive storage, temporary storage, non-volatile memory, flash memory, optical memory, or any other suitable memory for storing software objects and/or computer instructions. In some embodiments, the fuel cell controller 334 also includes a user interface (not shown). The user interface may include a display or other element (e.g., a button, joystick, etc.) capable of receiving an operator input to adjust any of the operational parameters of any of the components described herein.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method for addressing electrical grid frequency transients by a fuel cell system, the method comprising:
   measuring, by a frequency sensor, a frequency of an electrical grid;
   determining that the frequency of the electrical grid differs from a normal frequency of the electrical grid by a threshold amount, wherein determining that the frequency of the electrical grid differs from the normal frequency by the threshold amount includes inputting the measured frequency of the electrical grid into a frequency vs. kW droop function, the frequency vs. kW droop function providing an AC power setpoint bias as an output;
   determining, based at least in part on the measured frequency, the AC power setpoint bias;
   applying a magnitude limit, a rate-of-change limit, and a duration limit to the determined AC power setpoint bias to generate a limited power setpoint bias;
   generating a frequency adjusted power setpoint based on the limited power setpoint bias; and
   providing the frequency adjusted power setpoint to one or more control modules of the fuel cell system such that the fuel cell system adjusts a power output based on a difference between the measured frequency and the normal frequency.

2. The method of claim 1, wherein the AC power setpoint bias is proportional to the difference between the measured frequency of the electrical grid and the normal frequency.

3. The method of claim 1, wherein a deadband adjustment and a slope adjustment are also inputs to the frequency vs. kW droop function, wherein the threshold amount is determined based on the deadband adjustment, and wherein the slope adjustment determines the magnitude of the AC power setpoint bias as a function of the difference.

4. The method of claim 3, wherein the deadband adjustment and the slope adjustment are provided by an operator of the fuel cell system through a user interface.

5. The method of claim 1, wherein, prior to the determination that the measured frequency differs from the normal frequency by the threshold amount, the fuel cell system is operating at an AC power setpoint.

6. The method of claim 5, wherein applying the magnitude limit includes inputting the AC power setpoint bias into a bipolar limiter function to keep the power output of the fuel cell system within a predetermined range, wherein the predetermined range is a percentage of the AC power setpoint.

7. The method of claim 5, wherein generating the frequency adjusted power setpoint based on the limited power setpoint bias includes inputting the AC power setpoint and the limited power setpoint bias to a summation function to produce a frequency adjusted AC power setpoint and converting the frequency adjusted AC power setpoint to a frequency adjusted DC power setpoint.

8. The method of claim 1, wherein the one or more control modules of the fuel cell system include at least one of an airflow control module that controls an amount of air provided to the fuel cell system, a fuel flow control module that controls the amount of fuel provided to the fuel cell system, and an inverter control module configured to control an inverter of the fuel cell system.

9. The method of claim 8, further comprising:
generating dynamic proportional, integral, and derivative (PID) tuning parameters for the one or more control modules; and
in response to determining that the frequency of the electrical grid differs from the normal frequency of the electrical grid by the threshold amount, providing the PID tuning parameters to the one or more control modules to coordinate adjustment of the power output with adjustments to the amount of fuel and the amount of air provided to the fuel cell system.

10. The method of claim 9, further comprising, in response to determining that the frequency of the electrical grid differs from the normal frequency of the electrical grid by the threshold amount, providing a feed forward control signal to the one or more control modules such that control parameters of the one or more control modules temporarily depart from control parameters provided by the PID tuning parameters.

11. A fuel cell system comprising:
a fuel cell unit configured to generate an amount of electrical power for supply to an electrical grid;
a frequency sensor configured to measure a frequency of the electrical grid; and
a fuel cell controller communicatively coupled to the fuel cell unit and the frequency sensor, the fuel cell controller configured to:
determine that the measured frequency of the electrical grid differs from a normal frequency of the electrical grid by a threshold amount, wherein determining that the frequency of the electrical grid differs from the normal frequency by the threshold amount includes inputting the measured frequency of the electrical grid into a frequency vs. kW droop function, the frequency vs. kW droop function providing an AC power setpoint bias as an output;
determine, based at least in part on the measured frequency, the AC power setpoint bias;
apply a magnitude limit, a rate-of-change limit, and a duration limit to the determined AC power setpoint bias to generate a limited power setpoint bias;
generate a frequency adjusted power setpoint based on the limited power setpoint bias; and
provide control signals to one or more subsystems of the fuel cell system based on the frequency adjusted power setpoint.

12. The fuel cell system of claim 11, wherein the one or more subsystems of the fuel cell system include at least one of an airflow control module that controls an amount of air provided to the fuel cell system, a fuel flow control module that controls the amount of fuel provided to the fuel cell system, and an inverter control module configured to control an inverter of the fuel cell system.

13. The fuel cell system of claim 12, wherein the controller is further configured to:
generate dynamic proportional, integral, and derivative (PID) tuning parameters for the one or more subsystems; and
in response to determining that the frequency of the electrical grid differs from the normal frequency of the electrical grid by the threshold amount, provide the PID tuning parameters to the one or more control modules to coordinate adjustment of a power output with adjustments to the amount of fuel and the amount of air provided to the fuel cell system.

14. The fuel cell system of claim 13, wherein the fuel cell controller is further configured to, in response to determining that the frequency of the electrical grid differs from the normal frequency of the electrical grid by the threshold amount, provide a feed forward control signal to the one or more control modules such that control parameters of the one or more control modules temporarily depart from control parameters provided by the PID tuning parameters.

15. The fuel cell system of claim 11, wherein the AC power setpoint bias is proportional to a difference between the measured frequency of the electrical grid and the normal frequency.

16. The fuel cell system of claim 11, wherein a deadband adjustment and a slope adjustment are also inputs to the frequency vs. kW droop function, wherein the threshold amount is determined based on the deadband adjustment, wherein the slope adjustment determines the magnitude of the AC power setpoint bias as a function of the difference.

17. A fuel cell system comprising:
a fuel cell unit configured to generate an amount of electrical power for supply to an electrical grid;
a frequency sensor configured to measure a frequency of the electrical grid; and
a fuel cell controller communicatively coupled to the fuel cell unit and the frequency sensor, the fuel cell controller configured to:
determine that the measured frequency of the electrical grid differs from a normal frequency of the electrical grid by a threshold amount, wherein, prior to the determination that the measured frequency differs from the normal frequency by the threshold amount, the fuel cell system is operating at an AC power setpoint;
determine, based at least in part on the measured frequency, an AC power setpoint bias;

apply a magnitude limit, a rate-of-change limit, and a duration limit to the determined AC power setpoint bias to generate a limited power setpoint bias, wherein applying the magnitude limit includes inputting the AC power setpoint bias into a bipolar limiter function to keep a power output of the fuel cell system within a predetermined range, wherein the predetermined range is a percentage of the AC power setpoint;

generate a frequency adjusted power setpoint based on the limited power setpoint bias; and provide control signals to one or more subsystems of the fuel cell system based on the frequency adjusted power setpoint.

18. The fuel cell system of claim 17, wherein generating the frequency adjusted power setpoint based on the limited power setpoint bias includes inputting the AC power setpoint and the limited power setpoint bias to a summation function to produce a frequency adjusted AC power setpoint and converting the frequency adjusted AC power setpoint to a frequency adjusted DC power setpoint.

\* \* \* \* \*